United States Patent

[11] 3,619,304

[72] Inventors Makoto Naito
Tokyo;
Akinobu Kasami, Yokohama-shi; Masaru
Kawachi, Tokyo, all of Japan

[21] Appl. No. 852,754

[22] Filed Aug. 25, 1969

[45] Patented Nov. 9, 1971

[73] Assignee Tokyo Shibaura Electric Co., Ltd.
Kawasaki-shi, Japan

[32] Priorities Aug. 30, 1968

[33] Japan

[31] 43/61775;
Mar. 8, 1969, Japan, No. 44/17797

[54] METHOD OF MANUFACTURING GALLIUM PHOSPHIDE ELECTRO LUMINESCENT DIODES
10 Claims, 3 Drawing Figs.

[52] U.S. Cl. .......... 148/171, 23/204, 148/1.5, 148/1.6, 148/172, 148/173, 252/62.3, 313/108, 317/235 N

[51] Int. Cl. .......... H01l 7/38, H01l 7/46, H05b 33/00

[50] Field of Search .......... 148/171–173, 1.5, 1.6; 252/62.3; 317/234, 235; 313/108; 23/204

[56] References Cited

UNITED STATES PATENTS

| | | | |
|---|---|---|---|
| 3,365,630 | 1/1968 | Logan et al. | 317/237 |
| 3,470,038 | 9/1969 | Logan et al. | 148/171 |
| 3,540,941 | 11/1970 | Lorenz et al. | 148/1.5 |
| 3,549,401 | 12/1970 | Buszko et al. | 148/172 X |

OTHER REFERENCES

Gershenzon et al. " Light Emission from Forward Biased p–m Junctions in Gallium Phosphide" Solid State Electronics, Vol. 5, pp. 313–329, 1962.

Lorenz et al. " Preparation and Properties of Solution–Grown Epitaxial p–m Junctions in Gap" J. Applied Physics, Vol. 37, No. 11, pp. 4094–4102, 1966.

Trumbore et al. " Efficient Electroluminescence in Gap p–m Junctions– –" J. Applied Physics, Vol. 38, No. 4, pp. 1987–1988, March 15, 1967.

Kressel et al. " Effect of the Donor Concentration on the Optical Efficiency– – –" Solid State Electronics, Vol. 11, pp. 647–652, 1968.

*Primary Examiner*—L. Dewayne Rutledge
*Assistant Examiner*—W. G. Saba
*Attorney*—George B. Oujevolk

ABSTRACT: A gallium phosphide electro luminescent diode is fabricated by contacting molten gallium containing gallium phosphide, an N-type impurity and oxygen with a P-type gallium phosphide substrate and then slowly cooling the substrate to epitaxially grow an N-type gallium phosphide layer on the substrate, preferably on the (111) phosphorus surface thereof.

METHOD OF MANUFACTURING GALLIUM PHOSPHIDE ELECTRO LUMINESCENT DIODES

BACKGROUND OF THE INVENTION

This invention relates to a method of manufacturing compound semiconductor electro luminescent diodes having PN junction and more particularly to a method of manufacturing gallium phosphide electro luminescent diodes by epitaxial technique.

As is well known in the art, electro luminescent diodes made of compound semiconductors such as gallium phosphide produce luminescence due to the recombination phenomenon of charge carriers injected by bias voltage applied across the PN junction in the forward direction from an exterior DC source. A typical example of manufacturing such gallium phosphide electro luminescent diodes is represented by the so-called liquid phase epitaxial method according to which gallium phosphide electro luminescent diodes have been fabricated in the following manner.

More particularly, zinc and oxygen are selected as the P-type impurity dopant which is doped into a gallium phosphide substrate. Further, oxygen is also doped to form luminescent centers. Said P-type substrate and molten gallium saturated with gallium phosphide and doped with tellulium as the N-type impurity are heated at a temperature of from about 1,000° to 1,200° C. and then said molten gallium is applied on the surface of the substrate. Thereafter, the substrate is slowly cooled at a rate of about 20° C./min. to epitaxially grow an N-type layer of gallium phosphide on the P-type gallium phosphide monocrystalline substrate, thus providing the desired semiconductor PN junction. Then electrodes and lead wires for connection to the external circuit are secured to the P-type gallium phosphide layer and N-type gallium phosphide layer, respectively, of the semiconductive PN junction to complete a gallium phosphide electro luminescent diode element.

As will be described later more in detail, the prior art gallium phosphide electro luminescent diode element fabricated in this manner is not yet satisfactory in that its external quantum efficiency (hereinafter termed the electro luminescent efficiency) representing the degree of luminescence which is manifested by the element when a forward bias voltage is applied across it from an external DC source is not sufficiently high for practical use and that the reproducibility of the product is not satisfactory as evidenced by the difference of more than 50 percent in the average electro luminescent efficiency of various lots subjected to the same manufacturing conditions. For this reason, at present, it is still difficult to manufacture such elements on a mass production basis.

These problems can be attributed to the following two principle reasons.

1. As is well known in the art, in order to cause gallium phosphide electro luminescent diodes manufactured by the above described method to luminate at high efficiencies under forward bias voltage impressed from the external DC source it is necessary to form as many as possible nearest neighbor pairs of zinc-oxygen which act as the electro luminescent center at the PN junction or at the portions close to the PN junction into which the minority carriers are injected. However, in the prior art gallium phosphide electro luminescent diode element manufactured as above described, although zinc-oxygen pairs are contained in its P-type gallium phosphide substrate, the N-type gallium phosphide layer grown by the liquid epitaxial method contains only tellurium with the result that the oxygen concentration at the PN junction is extremely low. It is important to note that there is a tendency that the PN junction is actually formed in the epitaxial layer of out-diffusion of zinc into the epitaxial layer during growth. As is well known in the art the diffusion velocity of zinc is much faster than that of oxygen thus greatly decreasing the oxygen concentration near the PN junction whereby the electro luminescent efficiency is lowered.

2. In the N-type gallium phosphide layer grown by the liquid epitaxial method and doped with tellurium, the N-type impurity, as the radius of the tellurium atoms is large, various lattice defects are caused, making it difficult to obtain perfect crystals. This results in the poor reproducibility of gallium phosphide electro luminescent elements.

The prior art method has tried to randomly grow the N-type gallium phosphide layer by the liquid phase epitaxial method without regarding the orientation of the crystal with respect to the P-type gallium phosphide substrate and this method impairs not only the electro luminescent efficiency but also the reproducibility of the gallium phosphide electro luminescent diode elements. We have also found that the substrate orientation is significant when the N-type gallium phosphide layer is doped with oxygen in addition to an N-type impurity according to the method of this invention, as will be described later in more detail.

SUMMARY OF THE INVENTION

The object of this invention is to provide a new and improved method of manufacturing gallium phosphide electro luminescent diodes having greatly improved electro luminescent efficiency and improved reproducibility.

According to this invention oxygen is doped in the N-type gallium phosphide layer in addition to an N-type impurity and further, the crystal orientation of the P-type gallium phosphide substrate on which an N-type gallium phosphide containing an N-type impurity and oxygen is grown, is specifically directed to the (111) phosphorus surface.

DESCRIPTION OF THE PREFERRED EMBODIMENTS

Figure 1:
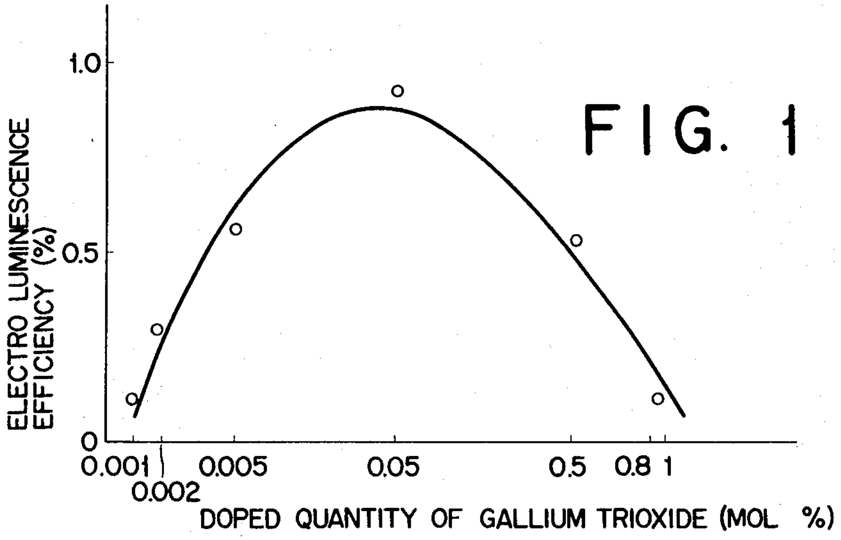
FIG. 1 is a graph to show the relationship between the quantity of doping (mole percent of gallium oxide ($Ga_2O_3$) in the molten gallium utilized to form a doped region of an N-type gallium phosphide in accordance with one embodiment of this invention and the electro luminescent efficiency (percent) of the gallium phosphide electro luminescent diode.

The following examples are given by way of illustration and not limitation.

EXAMPLE 1

First a P-type gallium phosphide substrate was prepared by slow cooling of molten gallium solution containing 6 mole percent of gallium phosphide, about 0.04 mole percent of zinc, as P-type impurity, and 0.06 mole percent of gallium oxide ($Ga_2O_3$). Then molten gallium melted at a temperature ranging from 1,000° to 1,200° C., preferably at 1,100° C., and containing 6 mole percent of gallium phosphide (GaP), about 0.015 percent of a substance (in this example, tellurium) selected from the group consisting of tellurium, selenium and sulfur, and about 0.035 mole percent of gallium oxide, preferably in the form of gallium trioxide ($Ga_2O_3$) was applied on the P-type gallium phosphide and the substrate was then cooled slowly at a rate of about 20° C./min. to grow an N-type gallium phosphide layer by the liquid phase epitaxial technique thus forming the desired semiconductor PN junction. Electrodes for connection to external circuit were applied to the P-type gallium phosphide region and N-type gallium phosphide region, respectively, of the semiconductor PN junction, thus completing a gallium phosphide electro luminescent diode element. One method of applying the molten gallium on the P-type gallium phosphide substrate comprises the steps of placing the molten gallium at one end of a carbon boat mounted in a horizontal type growing furnace and the P-type gallium phosphide substrate at the other end and slanting the furnace to cause the molten gallium to flow over the surface of the substrate.

When a DC bias voltage was applied across the PN junction of the gallium phosphide electro luminescent diode element prepared according to the method of this invention described above, it was found that the electro luminescent efficiency was ranged from about 0.5 to 0.8 percent at a current density of about 1.4 A/cm², the means value thereof being about 0.7 percent. Also the reproducibility was excellent. More particularly, the result of random experiments made on a number of lots (each lot consisting of 16 electro luminescent diode elements) under the same manufacturing conditions showed that the difference between mean electro luminescent efficiencies of respective lots was only less than 10 percent. In contrast, in gallium phosphide electro luminescent diode elements fabricated by the aforementioned prior art method the electro luminescent efficiency varied greatly, viz from 0 (did not luminesce under the same condition as that of the novel electro luminescent diode elements) to 0.5 percent, the mean value being approximately 0.1 percent. With regard to the reproducibility, the mean electro luminescent efficiencies differed more than 50 percent in random comparison tests made on different lots under the same condition.

Table 1 below compares the characteristics of gallium phosphide electro luminescent diode elements prepared by the prior method and those by the method by example 1. Table 1 also shows the results of example 2 wherein the quantity of gallium trioxide ($Ga_2O_3$) incorporated into the molten gallium for the purpose of forming the N-type gallium phosphide region was varied to 0.5 mole percent and example 3 wherein the quantity of gallium trioxide was varied to 0.005 mole percent, with other parameters being unchanged.

are injected upon application of a forward DC bias across the PN junction is much larger than the prior art. It is clear that such zinc-oxygen pairs are formed in a sufficiently large number at or near the PN junction of the diode element fabricated according to this invention even when the surface of such PN junction is formed in the epitaxial layer rather than the original surface of the substrate by out-diffusion of zinc, which is the P-type impurity previously doped in the P-type gallium phosphide substrate, during growth of the N-type gallium phosphide by the liquid epitaxial growing method.

2. With regard to the excellent reproducibility it is considered that tellurium atoms of larger radius and oxygen atoms of smaller radius compensate each other to improve crystalline characteristics of the grown layer of the N-type gallium phosphide because oxygen was simultaneously doped in the N-type gallium phosphide in the form of gallium trioxide in addition to the N-type impurity, tellurium.

According to the prior method, (111) gallium surface or (111) phosphorus surface of the P-type gallium phosphide substrate was used as the growth surface of the N-type gallium phosphide by the liquid phase epitaxial method and such random utilization of the growth surface has reduced the electro luminescent efficiency of the gallium phosphide electro luminescent diode elements obtained and has increased by difference in the characteristics as shown in table 2 below. By our crystallographic investigation, the reason of above mentioned is revealed as follows. Where the crystal orientation of the P-type gallium phosphide substrate on which the N-type gallium phosphide is grown is selected to be the (111) gallium surface or the (111) phosphorus surface, owing to the difference in compatibility between the N-type impurity (for example, tellurium) and the P-type gallium phosphide the impurity concentration varies greatly in the N-type gallium phosphide region, especially near the interface between it and the P-type gallium phosphide region whereas when the growth surface is selected at the (111) gallium surface, the net donor concentration decreases than the case where the (111) phosphorus surface is selected. For this reason, when the (111) gallium surface on the substrate is selected as the growth surface for the N-type gallium phosphide the width of the PN junction is increased substantially so that the injection efficiency of the minority carriers will be decreased when a forward bias voltage is impressed across the PN junction thus decreasing the electro luminescent efficiency. It was noted that the difference in the impurity concentration in the N-type gallium phosphide region between the case where the (111) gallium surface on the substrate is selected as the growth surface for the N-type gallium phosphide and the case wherein the (111) phosphorus surface is selected becomes remarkable as the concentration of the N-type impurity to be doped decreases.

TABLE 1

| | Quantity of dopant in the N-type gallium phosphide layer, mole percent | Difference | Electro luminescent efficiency, percent | Mean electro luminescent efficiency, percent |
|---|---|---|---|---|
| This invention: | | | | |
| Example 1 | Te: 0.015<br>$Ga_2O_3$: 0.035<br>GaP: 6.0 | Less than ±10%. | 0.5–0.8 | 0.7 |
| Example 2 | Te: 0.015<br>$Ga_2O_3$: 0.005<br>GaP: 6.0 | do | 0.3–0.6 | 0.4 |
| Example 3 | Te: .015<br>$Ga_2O_3$: 0.5<br>GaP: 6.0 | do | 0.3–0.6 | 0.4 |
| Prior art | Te: 0.015<br>$Ga_2O_3$: 0<br>GaP: 6.0 | Less than ±50%. | 0–0.3 | 0.1 |

FIG. 1 of the accompanying drawing shows the relationship between the quantity of gallium trioxide doped (in mole percent) and the electro luminescent efficiency of the gallium phosphide electro luminescent diode elements where the quantity of gallium trioxide ($Ga_2O_3$) doped in the molten gallium utilized for the purpose of forming the N-type gallium phosphide regions was changed variously.

As can be clearly noted from FIG. 1 the novel method of manufacturing gallium phosphide electro luminescent elements can greatly improve not only the quality of the products but also the mass producibility thereof. It will be noted that gallium phosphide electro luminescent diode elements doped with 0.002 to 0.8 mole percent of gallium trioxide have excellent electro luminescent efficiencies.

The reason that the gallium phosphide electro luminescent diode elements fabricated by the method of this invention have higher electro luminescent efficiency and reproducibility than those fabricated by the prior method can be attributed to the following reasons.

1. First, with regard to the improved electro luminescent efficiency it is considered that the number of nearest neighbor pairs of zinc-oxygen acting as the luminescent centers concentrated at or near the PN junction into which minority carriers Table 2 below compares the characteristics of the gallium phosphide electro luminescent diode elements of examples 4 and 5 and control examples 1 and 2 where the (1110 gallium surface and the (111) phosphorus surface were selected respectively as the doping surfaces for the N-type gallium phosphide.

TABLE 2

| Example | Orientation of the substrate surface | Quantity of dopant in the N-type gallium phosphide layer, mole percent | Difference | Mean electro luminescent efficiency, percent |
|---|---|---|---|---|
| Example 4 | (111) P surface | Te:0.015 $Ga_2O_3$:0.035 GaP:6.0 | Less than ±5% | 1.1 |
| Example 5 | (111) Ga surface | Te:0.015 $Ga_2O_3$: 0.035 GaP: 6.0 | Less than ±10% | 0.48 |
| Control Example 1 | (111) P surface | Te: 0.015 GaP: 6.0 | ±50% | 0.21 |
| Control Example 2 | (111) Ga surface | Te: 0.015 GaP: 6.0 | ±50% | 0.20 |

Mean electro luminescence efficiency was about 0.7 as shown in example 1 in table 1 whereas, as is obvious from example 4 of this table, when the phosphorus surface of the substrate is selected as the growth surface for N-type gallium phosphide, the mean electro luminescence efficiency was increased to 1.1 percent and the difference in the reproducibility was increased from less than ± 10 percent to less than ± 5 percent. On the other hand, when the gallium surface of the substrate was selected as the growth surface for the N-type gallium phosphide, in the case of example 5 shown in table 2, the mean electro luminescent efficiency was about 0.48 percent and the difference in reproducibility was less than ± 10 percent, each of these data being much inferior to the informer case wherein posphorus surface was selected.

Control examples 1 and 2 shown in table 2 show that in the prior art element shown in table 1 or the gallium phosphide electro luminescent diode elements which were not doped oxygen in the N-type gallium phosphide region, whether the (111) gallium surface or the (111) phosphorus surface on the P-type gallium phosphide substrate was selected as the doping plane for the N-type gallium phosphide, the reproducibilities as well as the mean electro luminescent efficiencies did not differ materially and that these properties were slightly better in the case of the (111) phosphorus surface than the (111) gallium surface. For this reason, it is considered that in the prior method, the (111) gallium surface or the (111) phosphorus surface on the P-type gallium phosphide substrate was randomly chosen as the doping surface for the N-type gallium phosphide in the liquid phase epitaxial grow method. The reason for this may be considered as follows.

More particularly, in the gallium phosphide electro luminescent diode elements fabricated by the prior art method, the mean electro luminescent efficiency is extremely low and as the electro luminescent efficiency varies over a very wide range from one lot to the other. Therefore it is extremely difficult to find out such effect of substrate orientation in practice. The reason for the remarkable improvements in the mean electro luminescent efficiency and reproducibility resulted from the practice of this invention may be attributed to the simultaneous doping of the N-type impurity and oxygen in the N-type gallium phosphide region.

We have investigated the crystal orientation of the P-type gallium phosphide substrate on which the N-type gallium phosphide layer simultaneously doped with N-type impurity and oxygen is grown and found that in such an element the electro luminescent efficiency and reproducibility can be improved more well when the (111) phosphorus surface on the P-type gallium phosphide substrate is selected for doping N-type gallium phosphide than selecting the (111) gallium surface.

In this method the P-type substrate is maintained at high temperature for a considerable time (termed the holding time) before application of molten gallium on said substrate. Therefore the surface of the substrate is considered to be damaged. The result of our investigation shows that the degradation of the photo luminescent characteristics of the substrate surface during this holding time is different for the (111) phosphorus surface and for the (111) gallium surface.

Figure 3:
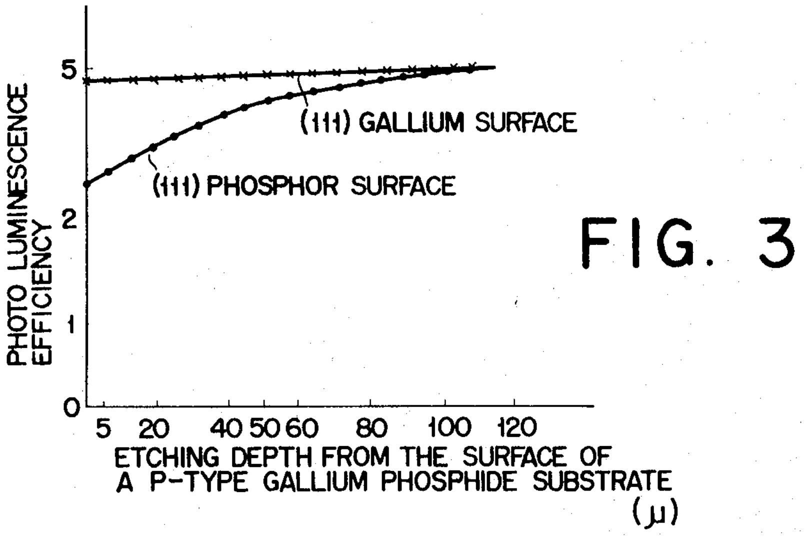
FIG. 3 is a graph to show the dependence of photo luminescence efficiency of P-type substrate heat-treated the depth from (111) gallium surface and (111) phosphorus surface.

Thus, for example, two P-type gallium phosphide substrates were mounted on a graphite base, one with its (111) phosphorus surface directed upward, the other (111) gallium surface directed upward and the substrates were heat-treated in argon atmosphere at a temperature of 1,100° C for 30 minutes. FIG. 3 shows how the photo luminescence efficiency of the P-type substrate changes with the depth from the substrate surface.

As can be clearly noted from FIG. 3 the photo luminescence efficiency does not decrease in any appreciable extent in the substrate with the (111) gallium surface whereas in the substrate with the (111) phosphorus surface, the photo luminescence efficiency is low in a region between the surface and the depth of about 50 microns, the degree of this degradation being dependent upon the ambient temperature in which the substrate was placed and said holding time.

Removal of this damaged layer is essential, when (111) phosphorus surface is used.

Figure 2:
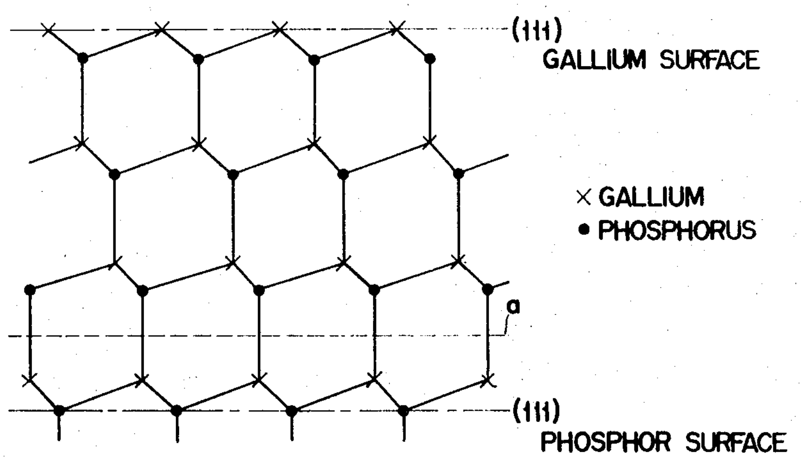
FIG. 2 is a model of the crystal structure of the gallium phosphide substrate when viewed in the direction of <110> crystal orientation.

We have removed to various depths the surface portions of the (111) phosphorus surface of the P-type gallium phosphide by liquid phase etching, for example, and grown the N-type gallium phosphide on the expose (111) phosphorus surface by the epitaxial growing method, and obtained the results shown by examples 6 to 10 in table 3 below. In this case, however, the etching operation was 3 such that a new (111) phosphorus surface will always be exposed as shown by a dotted line *a* in FIG. 2 wherein gallium Ga and phosphorus P appear in pairs and vertical bonds are not included.

TABLE 3

| Example | Depth of etching of (111) phosphide surface (microns) | Quantity doped in N-layer, mole percent | Difference, percent | Electro luminescent efficiency, percent |
|---|---|---|---|---|
| Example 6 | 50 | Te: 0.015 $Ga_2O_3$: 0.035 GaP: 6.0 | ±5 | 1.1 |
| Example 7 | 60 | Te: 0.015 $Ga_2O_3$: 0.035 GaP: 5.5 | ±5 | 1.1 |
| Example 8 | 25 | Te: 0.015 $Ga_2O_3$: 0.035 GaP: 7.0 | ±7 | 0.8 |
| Example 9 | 5 | Te: 0.015 $Ga_2O_3$: 0.035 GaP: 8.0 | ±10 | 0.50 |
| Example 10 | 0 | Te: 0.015 $Ga_2O_3$: 0.035 GaP: 9.0 | ±30 | 0.30 |
| Example 11 | 80 | Te: 0.015 $Ga_2O_3$: 0.035 GaP: 5.0 | ±30 | 0.28 |
| Example 12 | 70 | Te: 0.015 $Ga_2O_3$: 0.035 GaP: 5.5 | ±25 | 0.4 |

Thus, this table shows the results of etching to depths from the surface of 0, 5, 25, 50, 60, 70 and 80 microns, respectively, the (111) phosphorus surface of the P-type gallium phosphide substrate for growing the N-type gallium phosphide. As can be clearly noted from tables 2 and 3, in the gallium phosphide electro luminescent diode elements etched to a depth of 5 to 60 microns, their mean electro luminescent efficiency was further improved and the reproducibility was also increased with less difference in the characteristics.

In the above experiments, the depth of liquid phase etching was varied by varying the quantity of gallium phosphide incorporated into the molten gallium, and the depth of etching was determined by the microscopic observation of the finished electro luminescent diode elements. Namely, there is prepared a gallium solution containing gallium phosphide (GaP), gallium oxide ($Ga_2O_3$) and tallurium (Te) in such a manner that the amount of gallium phosphide dissolved therein accounts for 90 to 98 percent of its theoretical solubility. The P-type gallium substrate is coated with said solution to dissolve its surface.

The portion of the substration to be dissolved by said unsaturated solution can be controlled by the degree of unsaturation of said solution for its growth, as well as by the time the substrate is immersed in the solution and the temperature at which the solution is used.

From such etching process can be expected the improvement of the various properties of a gallium phosphide electroluminescent diode, which would be impossible with general chemical grinding, gas phase etching using carrier gas and etching utilizing slight increase in the temperature of a saturated solution. Examples 2 to 12 in the above tables 2 and 3 were prepared by the method described in connection with example 1.

We claim:

1. A method of manufacturing a gallium phosphide electro luminescent diode comprising the steps of preparing a P-type gallium phosphide substrate, contacting molten gallium containing gallium phosphide, an N-type impurity and oxygen with said P-type gallium phosphide substrate, and slowly cooling said substrate so as to epitaxially grow an N-type gallium phosphide layer on said P-type gallium phosphide substrate.

2. The method of manufacturing the gallium phosphide electro luminescent diode according to claim 1 wherein said oxygen id doped in said molten gallium in the form of gallium trioxide.

3. The method of manufacturing the gallium phosphide electro luminescent diode according to claim 1 wherein said molten gallium is contacted with said P-type gallium phosphide substrate at a temperature of from 1,000° to 1,200° C.

4. The method of manufacturing the gallium phosphide electro luminescent diode according to claim 1 wherein said P-type gallium phosphide substrate comprises a body of gallium phosphide doped with zinc and gallium oxide.

5. The method of manufacturing the gallium phosphide electro luminescent diode according to claim 1 wherein said N-type impurity doped in said molten gallium is a member selected from the group consisting tellurium, selenium and sulfur.

6. The method of manufacturing the gallium phosphide electro luminescent diode according to claim 2 wherein 0.002 to 0.8 mole percent of said gallium trioxide is doped in said molten gallium.

7. A method of manufacturing a gallium phosphide electro luminescent diode comprising the steps of preparing a P-type gallium phosphide substrate, contacting molten gallium containing gallium phosphide, an N-type impurity and oxygen with the (111) phosphide surface of said gallium phosphide substrate and slowly cooling said substrate so as to epitaxially grow an N-type gallium phosphide layer upon said (111) phosphorus surface of said P-type gallium phosphide substrate.

8. The method of manufacturing the gallium phosphide electro luminescent diode according to claim 7 wherein said (111) phosphorus surface of said P-type gallium phosphide substrate is etched and said layer of N-type gallium phosphide is epitaxially grown on the exposed (111) phosphorus surface.

9. The method according to claim 8 wherein said (111) phosphorus surface of said P-type gallium phosphide substrate is etched from 4 to 60 microns.

10. The method according to claim 8 wherein etching depth is controlled by the quantity of gallium phosphide disolved molten gallium.